United States Patent
Ghisiawan et al.

(10) Patent No.: US 7,146,551 B2
(45) Date of Patent: Dec. 5, 2006

(54) METHOD AND SYSTEM OF MODIFYING DATA IN FUNCTIONAL LATCHES OF A LOGIC UNIT DURING SCAN CHAIN TESTING THEREOF

(75) Inventors: Navin Amar Ghisiawan, Fort Collins, CO (US); Kevin M. Laake, Fort Collins, CO (US); John Richard Howlett, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 197 days.

(21) Appl. No.: 11/038,733

(22) Filed: Jan. 20, 2005

(65) Prior Publication Data

US 2006/0161826 A1    Jul. 20, 2006

(51) Int. Cl.
*G01R 31/28*    (2006.01)
(52) U.S. Cl. ..................................................... 714/726
(58) Field of Classification Search ............... None
See application file for complete search history.

(56) References Cited

U.S. PATENT DOCUMENTS 5,210,759 A    5/1993  DeWitt et al.
5,504,756 A *  4/1996  Kim et al. .................. 714/729
5,539,753 A    7/1996  Connor et al.
5,596,584 A    1/1997  Warren
5,619,511 A    4/1997  Sugisawa et al.
5,633,606 A    5/1997  Gaudet et al.
5,636,228 A    6/1997  Moughanni et al.
5,646,567 A    7/1997  Felix
5,719,876 A    2/1998  Warren
5,774,473 A    6/1998  Harley
6,348,825 B1   2/2002  Galbi et al.
6,356,107 B1   3/2002  Tang et al.
6,687,890 B1 * 2/2004  Sato ............................ 716/10
2003/0115525 A1* 6/2003 Hill et al. ................... 714/726

* cited by examiner

*Primary Examiner*—Christine T. Tu

(57) ABSTRACT

A method of modifying data of functional latches of a logic unit during scan chain testing thereof to verify a test case failure of a suspected cell comprises: (a) determining a test case failure in the logic unit through scan chain testing thereof; (b) suspending clocked operations of the logic unit; (c) during suspended clocked operations of the logic unit, performing the following steps: (i) reading logic states of the functional latches; and (ii) modifying the logic state of at least one of the functional latches based on the determined test case failure; (d) restarting clocked operations of the logic unit; and (e) reading logic states of the functional latches resulting from the modification to verify the test case failure of a suspected cell.

20 Claims, 5 Drawing Sheets

METHOD AND SYSTEM OF MODIFYING DATA IN FUNCTIONAL LATCHES OF A LOGIC UNIT DURING SCAN CHAIN TESTING THEREOF

BACKGROUND OF THE INVENTION

The present invention relates to scan chain testing of electrical systems, in general, and more particularly, to a method and system of modifying data in functional latches of a logic unit during scan chain testing thereof to verify a test case failure of a suspected cell.

Today's electrical systems are generally embedded in very large scale integrated (VLSI) circuits which contain hundreds of thousands if not millions of electrical cells. Usually, these cells are grouped into functional units which may include both combinational logic and sequential logic comprised of clocked memory elements referred to as functional latches. After fabrication, each VLSI circuit is tested to check the functionality of its logic circuits and the interconnections thereof. In order to expedite this process, the VLSI circuits are fabricated with test circuits, which may be in the form of JTAG scan chains, for example. JTAG scan chain circuits are constructed and operated by a test access process (TAP) controller in accordance with the IEEE standard 1149.1.

Typically, the latches of a functional unit within a VLSI circuit are interfaced to corresponding scan latches in a boundary scan chain as illustrated by way of example in the block diagram schematic of FIG. 1. More specifically, scan latches SL1, ..., SLN of a test scan chain are controlled by the TAP controller 10 to test the functional logic unit 12 shown within the dashed lines. Each scan latch SL1, ..., SLN is coupled to a corresponding functional latch FL1, ..., FLN in unit 12 by signal lines S1, ..., SN, respectively. Test bit patterns are supplied by the TAP controller 10 to the scan latches SL1, ..., SLN over a serial bus 14 which is daisy chained among the serial in (SI) and serial out (SO) ports of the latches SL1, ..., SLN. The serial bus 14 begins and ends in the TAP controller 10 so that resultant test data may be read from the scan latches SL1, ..., SLN to the TAP controller 10 thereover.

In operation, the TAP controller 10 may be operated by standardized JTAG bus signals TCK, TDI, TDO, TRST, and TMS to control the flow of test and resultant bit pattern date over the serial bus 14 through control signals comprising Shift, Update and Write provided to the scan latches SL1, ..., SLN over a parallel bus 16. The functional logic unit 12 may be synchronized in operation by a master system clock (MCK), for example. Accordingly, the TAP controller 10 may introduce a test bit pattern to and read the resultant bit pattern from the functional latches FL1, ..., FLN of unit 12 through the chain of scan latches SL1, ..., SLN via respective signal lines S1, ..., SN utilizing the clock MCK and control signals of bus 16. From the resultant bit pattern, the TAP controller 10 in cooperation with a Debug unit 18 may determine a failure in the functionality and/or circuit interconnection of the unit 12. However, as a result of the functional interdependency of the cells of the unit 12, it may not be possible to verify the particular cell or cells that have failed without further complex processing.

Accordingly, from this perspective, it is important and desirable to have a method and system of scan chain testing which may permit verifying the particular cell or cells causing the detected failure in a functional unit of a VLSI circuit. The present invention provides for such a method and system.

DETAILED DESCRIPTION OF THE INVENTION

Figure 1:
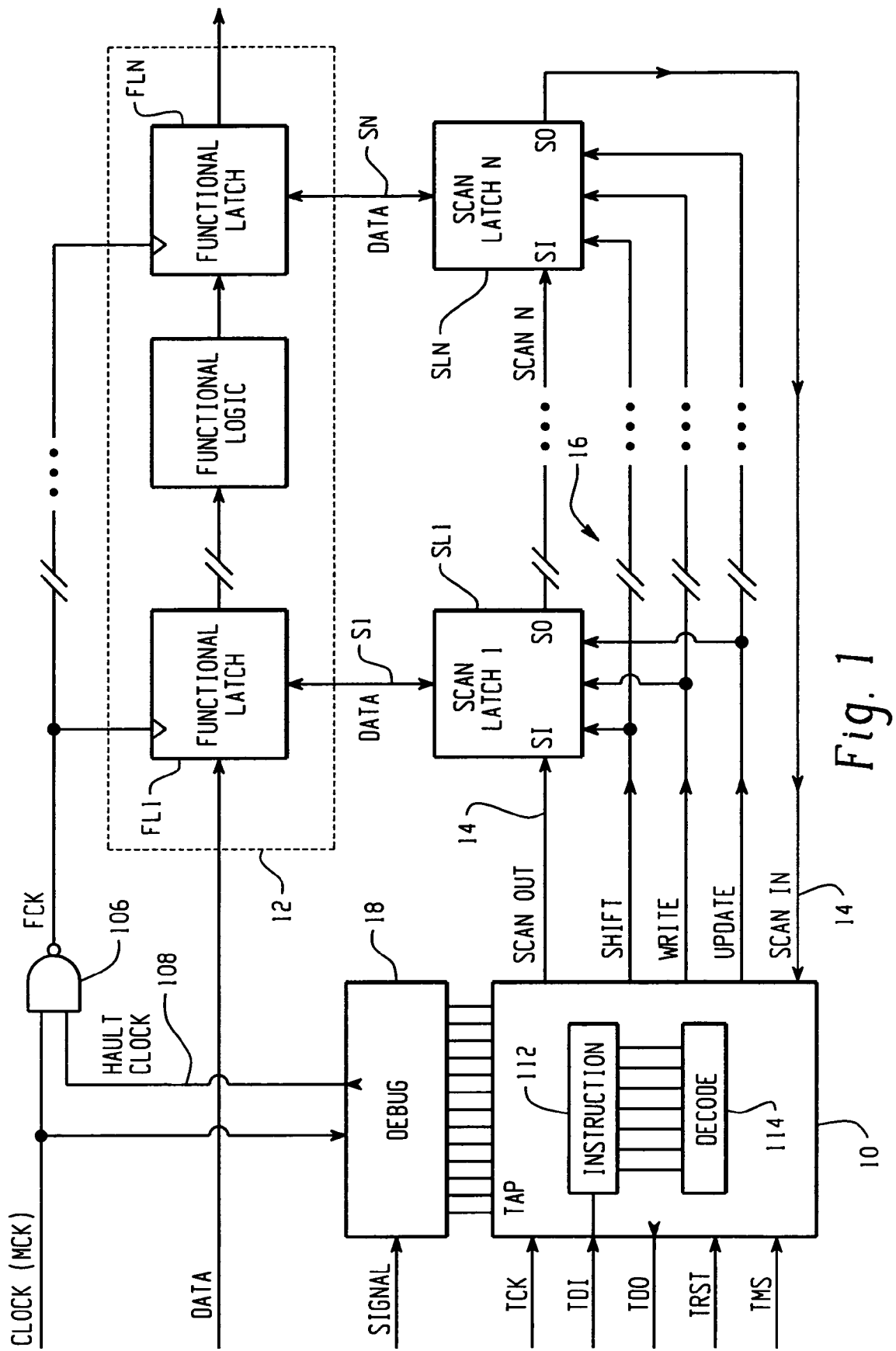
FIG. 1 is a block diagram schematic of an exemplary system for scan chain testing of a functional logic unit suitable for embodying one aspect of the present invention.
Figure 2:
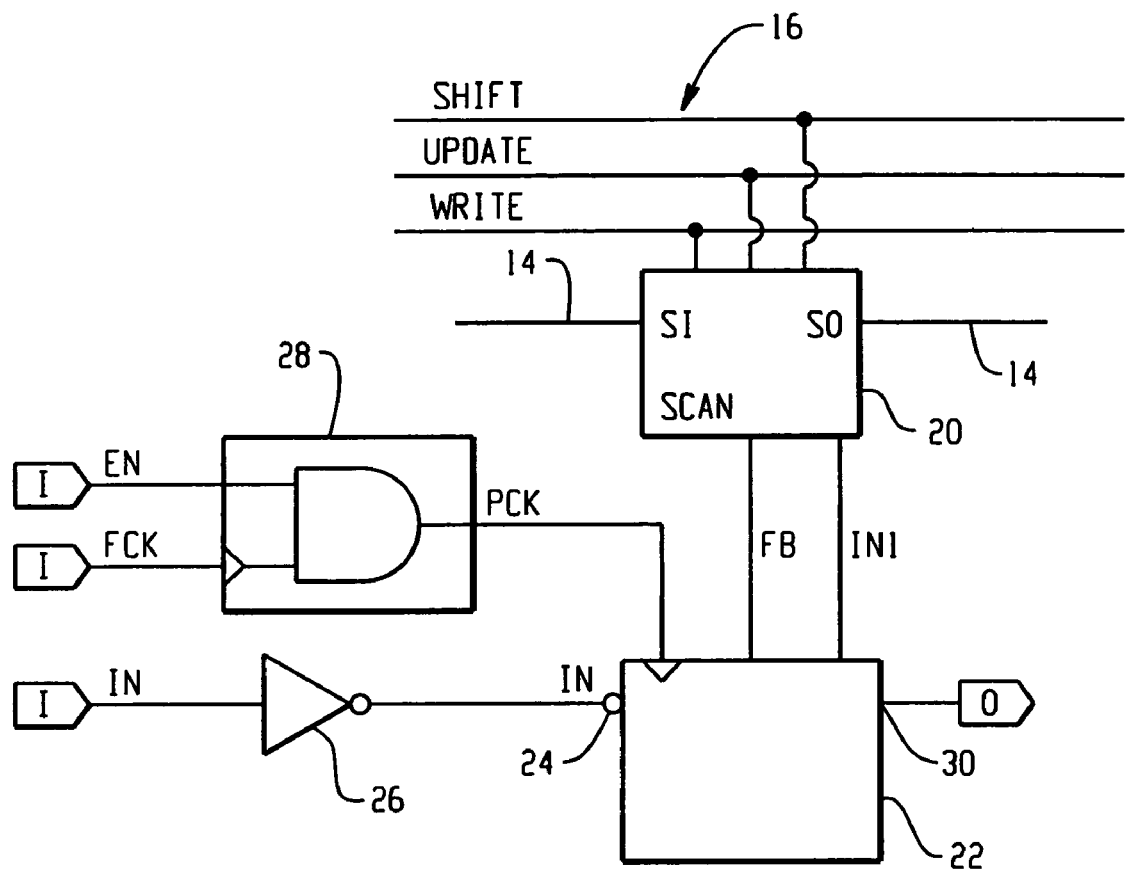
FIG. 2 is a block diagram schematic of an exemplary scan latch/functional latch combination suitable for use in the embodiment of FIG. 1.

An exemplary scan latch/functional latch combination circuit suitable for use in the embodiment of FIG. 1 is shown in the block diagram schematic of FIG. 2. Referring to FIG. 2, a scan latch 20 which is exemplary of the latches in the scan chain SL1, ..., SLN is coupled to its corresponding functional latch 22 in the functional logic unit 12 by way of two signal lines fb and in1. Under functional operation, data is provided to an input port 24 of the functional latch 22 over a signal line designated as "in". A gate 26 may be provided in the signal line "in" to buffer the data signal. A functional clock FCK, derived from the master clock MCK (see FIG. 1), having a rate of two-hundred megahertz (200 MHz), for example, controls the capturing of data at the port 24 by the latch 22. In the present embodiment, the clock FCK may be a square wave which may be converted to a short pulsed waveform (PCK) by a circuit 28. For example, the circuit 28 may produce a very short pulse on the order of seventy picoseconds (70 psec), for example, with each rising edge of the square waveform clock FCK to effect the clock PCK. Accordingly, at each pulse of PCK, data at port 24 is captured by the functional latch 22 and transferred to the output port 30.

As noted above, the scan latch 20 is also coupled to the serial bus 14 and to the control signals SHIFT, UPDATE and WRITE of the parallel bus 16. In a controllable test mode, test data may be shifted into the scan latch 20 via the serial bus 14 using the SHIFT signal of bus 16. The test data of scan latch 20 may be written to the signal lines fb and in1 by the TAP controller 10 by pulsing the WRITE signal of bus 16. The test data written to lines fb and in1 dominate over the data at the input port 24 of functional latch 22 so that at the next pulse of PCK, the test data instead of the input data at port 24 is captured and transferred to the output 30 of the functional latch 22. Thereafter, the functional latch 22 will perform its clocked operations within the functional logic unit 12 based on the initial test data received from the scan latch 20.

In an observable test mode, the scan latch 20 may observe the clocked or operational logic states of the functional latch 22 in response to the initial test data. In the observable test mode, the logic state of the functional latch 22 is provided to the scan latch 20 over signal lines fb and in1. When the TAP controller 10 desires to observe the state of the latch 22, it pulses the UPDATE signal of bus 16 which causes the latch 20 to sample or capture the data on lines fb and in1 and transfer the sampled data to the output scan port (SO)

thereof. The sampled data may then be shifted to the TAP controller 10 over the serial bus 14 using the SHIFT signal of bus 16.

Figure 3A:
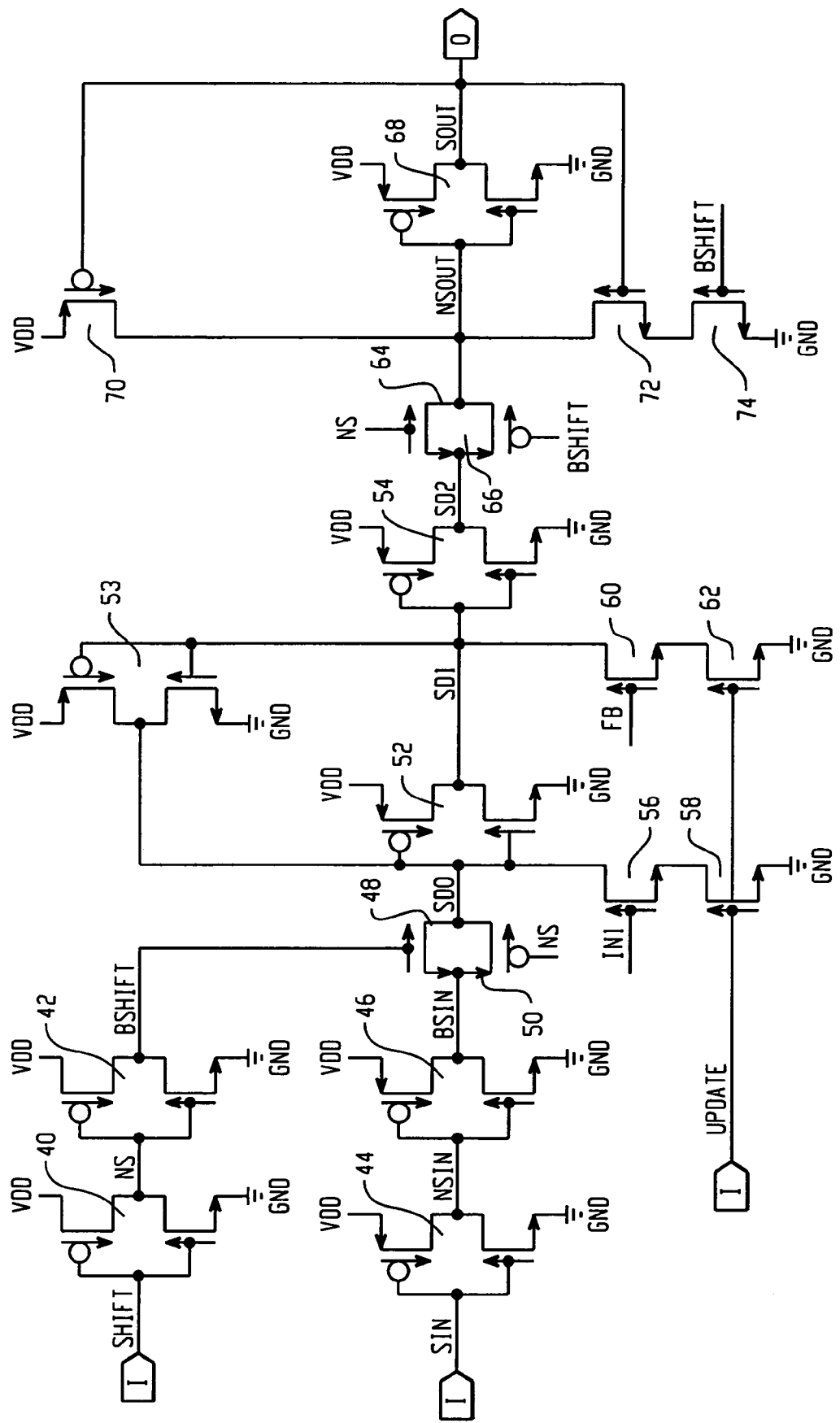
FIGS. 3A and 3B are, in composite, a circuit schematic of an exemplary scan latch suitable for use in the embodiment of FIGS. 1 and 2.
Figure 3B:
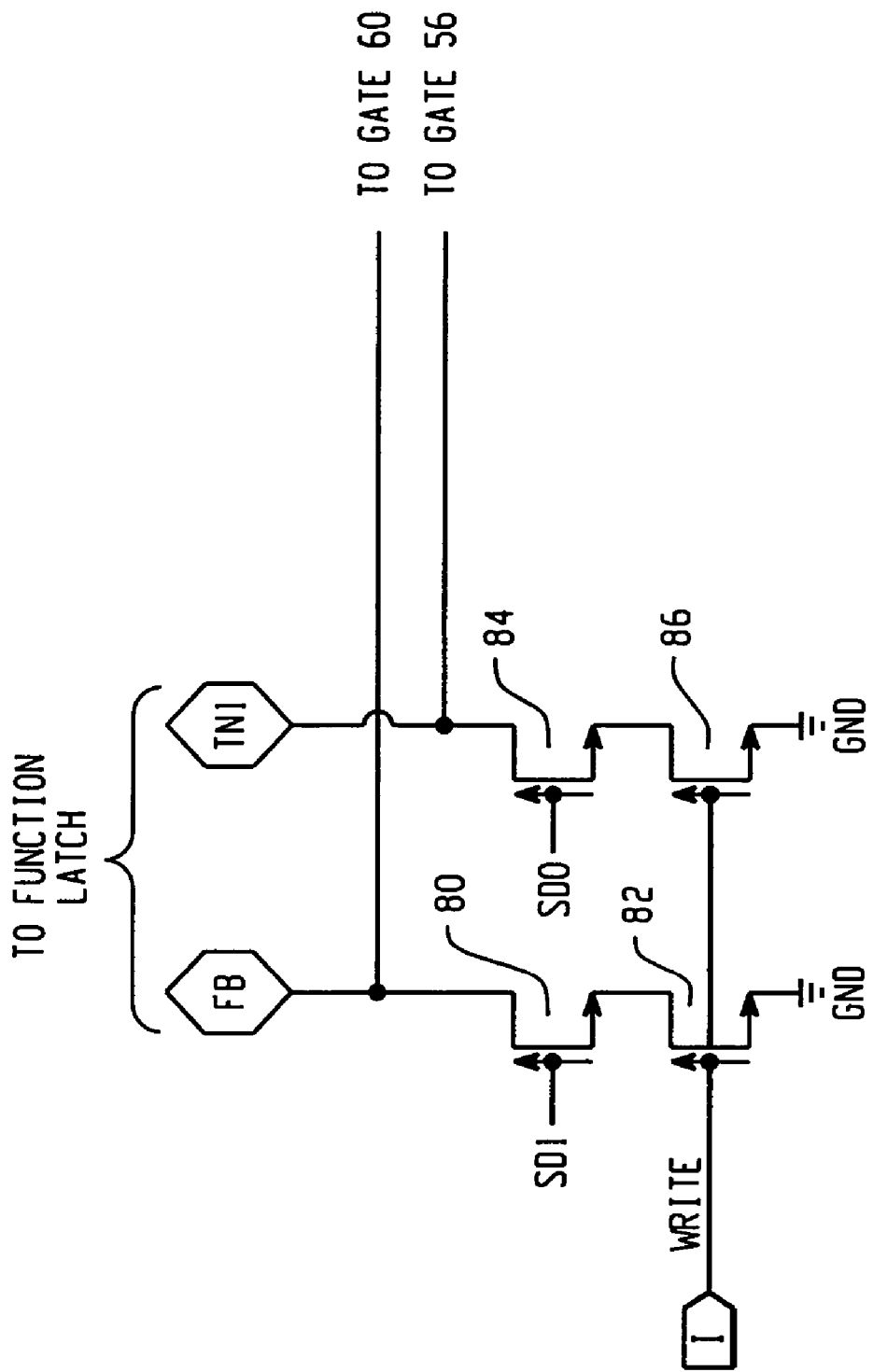

FIGS. 3A and 3B are, in composite, a circuit schematic of an exemplary scan latch suitable for use in the embodiment of FIGS. 1 and 2. The exemplary scan latch circuit is comprised of NMOS and PMOS transistors as well as complementary metal oxide semiconductor (CMOS) transistor pairs. All of the CMOS pairs of the circuit are coupled between the supply buses $V_{DD}$ and ground GND. Referring to FIGS. 3A and 3B, the SHIFT signal is coupled through a CMOS pair 40 to produce the signal ns which is coupled through another CMOS pair 42 to produce the signal bshift. Similarly, the scan in (sin) signal is coupled through a CMOS pair 44 to produce the signal nsin which is coupled through another CMOS pair 46 to produce the signal bsin. The signal bsin is coupled through the parallel channels of a pair of NMOS and PMOS transistors, 48 and 50, respectively, that are coupled source-to-source and drain-to-drain. The NMOS transistor 48 is gated by the signal bshift and the PMOS transistor 50 is gated by the complementary signal ns. The drain side of the transistor pair 48 and 50 effects the signal sd0 which is coupled through a CMOS pair 52 to produce the signal sd1 which is coupled through another CMOS pair 54 to produce the signal sd2. The signal sd1 is also coupled to the gates of another CMOS pair 53, the out put of which being coupled back to the signal sd0.

The signal sd0 is also coupled to ground GND through a pair of series connected NMOS transistors 56 and 58, transistor 56 being gated by the signal in1 and transistor 58 being gated by the signal UPDATE. Likewise, the signal sd1 is also coupled to GND through a pair of series connected NMOS transistors 60 and 62, transistor 60 being gated by the signal fb and transistor 62 being gated by the signal UPDATE. Signal sd2 is coupled through the parallel channels of a pair of NMOS and PMOS transistors, 64 and 66, respectively, that are coupled source-to-source and drain-to-drain. The NMOS transistor 64 is gated by the signal ns and the PMOS transistor 66 is gated by the complementary signal bshift. The drain side of the transistor pair 64 and 66 effects the signal nsout which is coupled through a CMOS pair 68 to produce the scan out signal sout. In addition, the signal nsout is coupled to $V_{DD}$ through a PMOS transistor which is gated by signal sout, and is also coupled to GND through a series connected pair of NMOS transistors 72 and 74, the transistor 72 being gated by the signal sout and the transistor 74 being gated by bshift.

The foregoing part of the scan latch circuit of FIGS. 3A and 3B permits scanning in of a test date pattern. For example, test date presented to the scan input port sin is shifted to the center section as signals sd0 and sd1 via transistor pair 48, 50 when SHIFT changes state, and then, shifted to the scan output port sout via transistor pair 64, 66 when SHIFT changes back to its static state. In this manner, serial test data may be shifted through the scan latches of the chain until all of the scan latches have the proper test data stored as sd0 and sd1. The test data stored in the latches may be written to their corresponding functional latches over signal lines fb and in1 using the scan latch circuitry which will now be described.

Referring to FIGS. 3A and 3B again, the signal lines fb and in1 are coupled to GND through respective pairs of NMOS transistors 80, 82 and 84, 86. The transistors 84 and 80 are gated by the signals sd0 and sd1, respectively, and the transistors 82 and 86 are both gated by the WRITE signal. Thus, the test data stored in the scan latch 20 as sd0 and sd1 may be transferred to the signal lines in1 and fb coupled to the functional latch 22 when the WRITE signal changes state. Thereafter, the test data over signal lines fb and in1 may be captured by the functional latch 22 in the next clock cycle.

In addition, with the WRITE signal in the dormant state, the logic states of signal lines fb and in1 are controlled by the logic state of the functional latch 22 and may be sampled (observed) by the scan latch 20. More specifically, when the signal UPDATE is pulsed, the logic states of lines in1 and fb are transferred to signals sd0 and sd1 via transistors pairs 56, 58 and 60, 62, respectively. The signals sd0 and sd1 control the logic state of sd2 which is transferred to the scan output port via transistor pair 64, 66 and CMOS pair 68. The sampled or observed resultant data from the functional latch 22 may be shifted serially back to the TAP controller 10 in the same manner as described above for scanning in data to the scan latches. The TAP controller 10 may analyze the response data to determine if a failure or failures have occurred.

Figure 5:
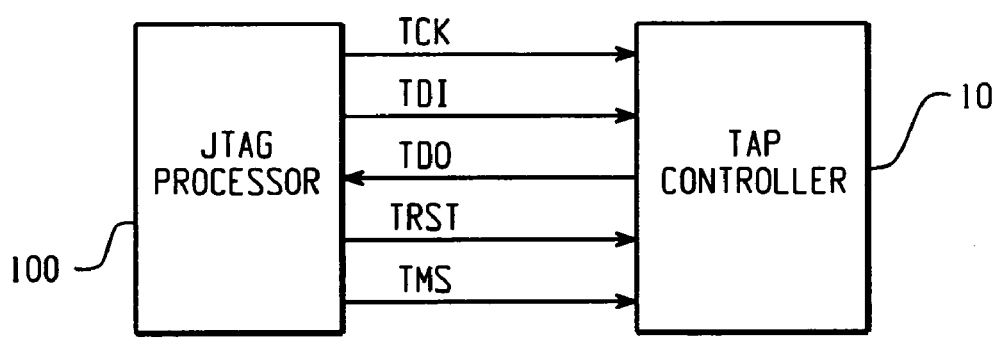
FIG. 5 is a block diagram schematic of an exemplary interface between a processor and scan chain testing controller suitable for use in the embodiment of FIG. 1.
Figure 4:
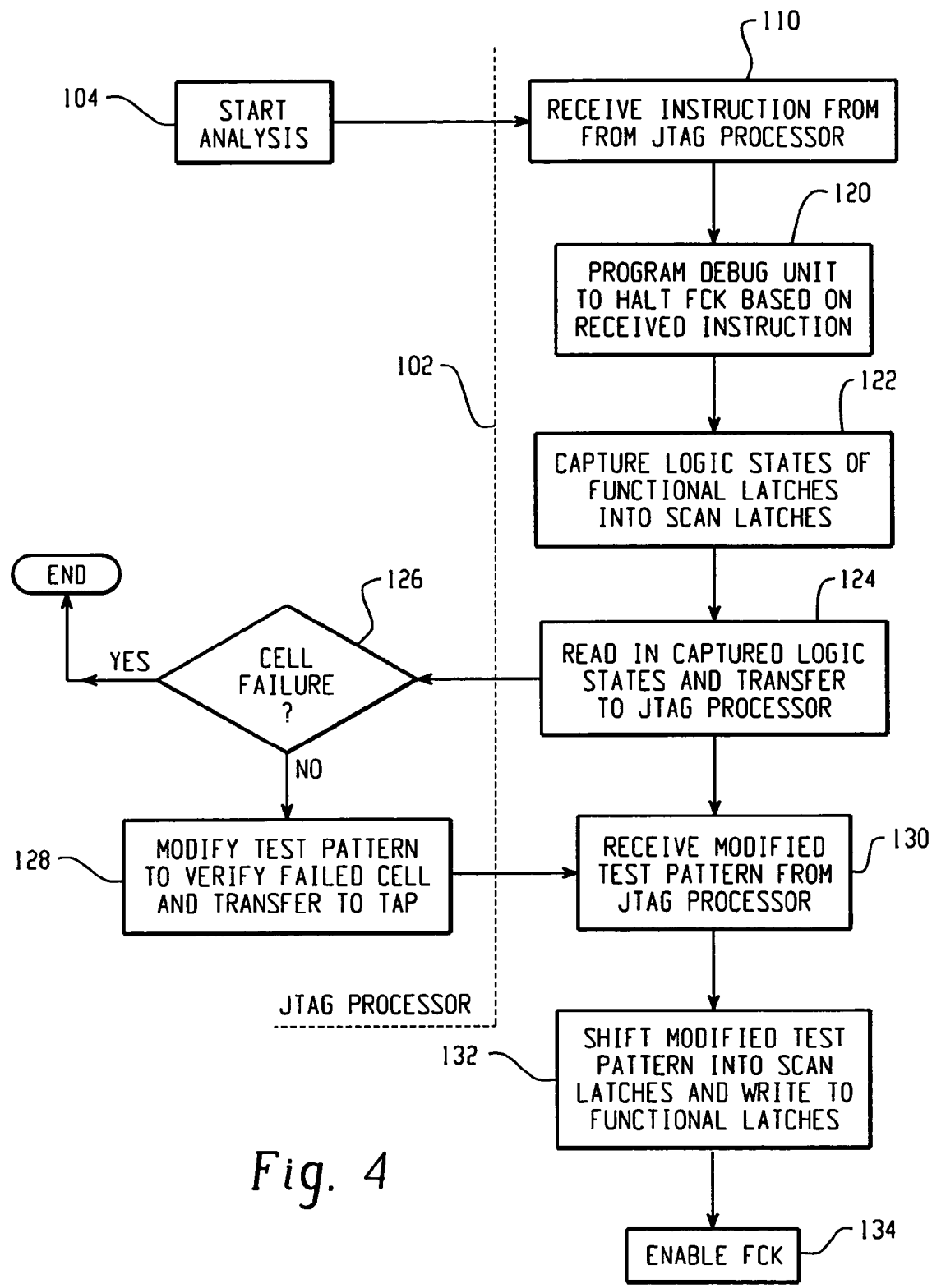
FIG. 4 is an exemplary flowchart of steps suitable for embodying another aspect of the present invention.

As noted above, while the TAP controller 10 may determine a failure in the logic unit 12 based on the observed resultant data, it is not capable without complex processing to verify the exact cell or cells in which the failure occurs. The present inventive methodology permits a test operator through use of a JTAG processor 100, which may be a personal computer (PC) or a workstation, for example, to isolate a region in the logic unit 12 and verify the failed cell by exercising the TAP controller 10 using standard JTAG test bus signals comprising TCK, TDI, TDO, TRST, TMS as shown in the block diagram of FIG. 5. The TAP controller 10 may be exercised through a sequence of steps as shown in the exemplary flowchart of FIG. 4.

For example, during a test operation of the functional logic unit 12, the captured logic states of the functional latches of the unit 12 may be read into the TAP controller 10 from the scan latches via serial bus 14 as described supra and transferred therefrom to the JTAG processor 100 over TDO, for example. In the JTAG processor 100, it may be determined from the sampled logic states of the functional latches if a failure has occurred in the logic unit 12. If a failure is detected, then an operator may initiate steps via the JTAG processor 100 in accordance with the present invention to verify the failed cell in unit 12. Referring to the exemplary flowchart of FIG. 4, the dashed line 102 separates the method steps between the JTAG processor 100 and the TAP controller 10 for the present embodiment. For example, those steps to left and right of the dashed line 102 may be carried out in the JTAG processor 100 and TAP controller 10, respectively. The exemplary flowchart of FIG. 4 will now be described in connection with the embodiment of FIGS. 1 and 5.

When the JTAG processor 100 detects a failed condition during a test operation of logic unit 12, it will start an analysis in step 104 which may include sending an instruction to the TAP controller 10 over signal line TDI, for example, to interrupt the clocked operation of the logic unit 12 and render it in a suspended state. The content of the instruction may include halting the clock FCK for a predetermined number of clock cycles. In the embodiment of FIG. 1, the clock FCK is derived from the clock MCK through a gate 106, for example. The clock FCK may be halted by disabling gate 106 by a halt clock signal 108 generated by the Debug unit 18. In the present embodiment, the clock MCK may be monitored by the Debug unit as a measure of time or number of cycles. Referring back to FIG. 4, the TAP controller 10 receives the instruction issued by processor 100 in step 110. It may store the instruction in an instruction register 112 for decoding by a decoder unit 114. In response to the instruction, the TAP controller 10 may program the Debug unit 18 in step 120 to halt the clock FCK for a predetermined number of MCK clock cycles. An example instruction may be as follows: "Halt FCK 1000 clock cycles after 10 signal transitions".

After the clocked operations of the logic unit 12 are suspended by halting the clock FCK, the TAP controller 10 may capture or sample the current logic states of the functional latches into their corresponding scan latches in step 122. As noted above, this step 122 may be accomplished, in the present embodiment, by pulsing the Update signal of bus 16 (see FIG. 1). Thereafter, in step 124, the sampled logic states are read or scanned into the TAP controller 10 via the serial bus 14 by pulsing the Shift signal of bus 16 for a number of cycles commensurate with the number of scan latches in the chain. When all of the sampled data is read into the TAP controller 10, step 124 controls the transfer of the sampled data to the JTAG processor 100 via line TDO, for example.

Then, the JTAG processor 100 may be used to determine a failed cell from the sampled logic states of the functional latches in step 126. If a failed cell can be determined, then the method ends; if not, then, in step 128, the operator may modify the current pattern of the logic states using the processor 100 to assist in verifying a failed cell in logic unit 12. One or more bits of the read in logic pattern may be changed to correct or amend (introduce) the logic state(s) of a suspected latch(es). Also, in step 128, the JTAG processor 100 may be controlled to transfer the modified pattern of logic states to the TAP controller 10 via line TDI, for example. In step 130, the TAP controller 10 receives the modified pattern from the processor 100, and, in step 132, shifts the pattern serially to the corresponding scan latches via the serial bus 14. Also, in step 130, the TAP controller 10 writes the modified pattern of logic states from the scan latches to the respective signal lines fb and in1 of their corresponding functional latches to replace the logic states currently in the functional latches.

Thereafter, the TAP controller 10 may restart the clock FCK in step 134 by removing the halt clock signal 108 from gate 106, for example. When the clock FCK is restarted, the functional latches will capture the new logic states form lines fb and in1 to assist in verifying a known or speculative failed cell or cells. Then, the logic unit 12 may perform in a clocked operation through a number of clock cycles as may be determined by the JTAG processor 100 and the steps of the method of FIG. 4 repeated starting at step 104. For example, if the processor 100 wants the logic unit 12 to perform through four clock cycles or signal transitions, it may issue an instruction to the controller 10 at step 10 to halt the clock FCK after four signal transitions. In response, the Debug unit 18 may count four clock cycles of the clock MCK and generate the halt clock signal 108. Thereafter, the method steps may be repeated starting at step 110.

In the foregoing described manner, the present embodiment may perform "write-on-the-fly" test data transitions during testing or debug operations to inject verification or correction logic states into one or more desired functional latches to verify one or more known or speculative failed cells of the functional logic unit. Thus, the method works well as a debug tool to allow an operator via the JTAG processor to test a certain failure, if the failure can be limited to a suspected cell of the logic unit, for example, by suspending clocked operations, injecting a corrected logic state into the latch of the cell during suspended clocked operation, and then, restarting clocked operations and determining if the failure disappears or appears as the case may be.

While the present invention has been presented herein above in connection with one or more embodiments, it is understood that all such embodiments were described merely by way of example with no intention of limiting the invention in any way. Accordingly, the present invention should not be limited by any of the presented embodiments, but rather construed in breadth and broad scope in accordance with the recitation of the claims appended hereto.

What is claimed is:

1. Method of modifying data of functional latches of a logic unit during scan chain testing thereof to verify a test case failure of a suspected cell, said method comprising:
    (a) determining a test case failure in said logic unit through scan chain testing thereof;
    (b) suspending clocked operations of said logic unit;
    (c) during suspended clocked operations of said logic unit, performing the following steps:
        (i) reading logic states of said functional latches; and
        (ii) modifying the logic state of at least one of the functional latches based on the determined test case failure;
    (d) restarting clocked operations of said logic unit; and
    (e) reading logic states of said functional latches resulting from said modification to verify the test case failure of a suspected cell.

2. The method of claim 1 including gating a clock signal to the logic unit for clocked operations thereof; and wherein step (b) includes disabling the gating of the clock signal to the logic unit.

3. The method of claim 2 wherein step (d) includes enabling the gating of the clock signal to the logic unit.

4. The method of claim 1 wherein step (c)(i) includes:
    reading the logic states of the functional latches into respectively corresponding scan latches of the scan chain; and
    scanning out said read in logic states from said scan chain latches.

5. The method of claim 1 wherein step (c)(ii) includes:
    scanning said modified logic states into scan latches of the scan chain; and
    transferring said scanned in logic states from said scan latches into respectively corresponding functional latches.

6. The method of claim 1 wherein step (e) includes reading logic states of the functional latches resulting from said modification after a predetermined number of clocked operations from restart.

7. The method of claim 1 wherein step (e) includes reading logic states of the functional latches resulting from said modification after a predetermined number of signal transitions from restart.

8. The method of claim 1 wherein step (e) includes:
    suspending clocked operations of the logic unit; and
    thereafter, reading logic states of said functional latches resulting from the modification.

9. The method of claim 1 wherein step (e) includes:
    suspending clocked operations after a predetermined number of clocked operations from restart; and
    thereafter, reading logic states of said functional latches resulting from the modification.

10. The method of claim 1 wherein step (e) includes:
    reading the logic states of the functional latches resulting from the modification into respectively corresponding scan latches of the scan chain; and scanning out said read in logic states from said scan chain latches.

11. System for modifying data of a plurality of functional latches of a logic unit during scan chain testing thereof to verify a test case failure of a suspected cell, said system comprising:
   a plurality of scan latches of a scan chain, each scan latch of said plurality coupled to a respectively corresponding functional latch of said plurality of functional latches;
   a controller for controlling the operations of said plurality of scan latches for scan chain testing to determine a failure in the logic unit;
   said controller operative to suspend clocked operations of the logic unit, and during suspended clocked operations of said logic unit, to read logic states of said functional latches and modify the logic state of at least one of the functional latches based on said determined failure; and
   said controller further operative to restart clocked operations of the logic unit after said modification, and to read logic states of said functional latches resulting from said modification to verify the failure of a suspected cell.

12. The system of claim 11 including means for gating the clock signal to the logic unit for clocked operations thereof; and wherein the controller is further operative to disable the gating means to suspend clocked operations of the logic unit.

13. The system of claim 12 wherein the controller is further operative to enable the gating means to restart clocking operations of the logic unit.

14. The system of claim 11 wherein the controller is further operative to control (a) reading the logic states of the functional latches into their respectively corresponding scan latches of the scan chain, and (b) scanning in said read in logic states from said scan chain latches.

15. The system of claim 11 wherein the controller is further operative to control (a) scanning the modified logic states into scan latches of the scan chain, and (b) transferring said scanned in logic states from the scan latches into respectively corresponding functional latches.

16. The system of claim 11 wherein the controller is operative to control reading logic states of the functional latches resulting from the modification after a predetermined number of clocked operations from restart.

17. The system of claim 11 wherein the controller is operative to control reading logic states of the functional latches resulting from the modification after a predetermined number of signal transitions from restart.

18. The system of claim 11 wherein the controller is operative to control (a) suspending clocked operations after a predetermined number of clocked operations from restart; and thereafter, (b) reading logic states of the functional latches resulting from the modification.

19. The system of claim 11 wherein the controller is operative to control (a) reading the logic states of the functional latches resulting from the modification into respectively corresponding scan latches of the scan chain; and (b) scanning out said read in logic states from the scan chain latches.

20. System for modifying data of a plurality of functional latches of a logic unit during scan chain testing thereof to verify a test case failure of a suspected cell, said system comprising:
   a plurality of scan latches of a scan chain, each scan latch of said plurality coupled to a respectively corresponding functional latch of said plurality of functional latches;
   means for controlling the operations of said plurality of scan latches for scan chain testing to determine a failure in the logic unit;
   means for suspend clocked operations of the logic unit, and during suspended clocked operations of said logic unit, for reading logic states of said functional latches and modifying the logic state of at least one of the functional latches based on said determined failure; and
   means for restarting clocked operations of the logic unit after said modification, and for reading logic states of said functional latches resulting from said modification to verify the failure of a suspected cell.

* * * * *